(12) United States Patent
Huang et al.

(10) Patent No.: US 7,923,787 B2
(45) Date of Patent: Apr. 12, 2011

(54) MOSFET WITH ISOLATION STRUCTURE AND FABRICATION METHOD THEREOF

(75) Inventors: Chih-Feng Huang, Jhubei (TW); Tuo-Hsin Chien, Tucheng (TW); Jenn-Yu Lin, Sindian (TW); Ta-Yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 420 days.

(21) Appl. No.: 11/913,044

(22) PCT Filed: Oct. 14, 2005

(86) PCT No.: PCT/CN2005/001687
§ 371 (c)(1),
(2), (4) Date: May 7, 2008

(87) PCT Pub. No.: WO2006/116902
PCT Pub. Date: Nov. 9, 2006

(65) Prior Publication Data
US 2008/0290410 A1   Nov. 27, 2008

(30) Foreign Application Priority Data
Apr. 29, 2005 (CN) .......................... 2005 1 0066850

(51) Int. Cl.
*H01L 21/70* (2006.01)

(52) U.S. Cl. ........................ 257/369; 438/199

(58) Field of Classification Search .................. 257/338, 257/369
See application file for complete search history.

(56) References Cited

U.S. PATENT DOCUMENTS

| | | | | |
|---|---|---|---|---|
| 5,548,147 | A | 8/1996 | Mei | 257/333 |
| 5,852,314 | A | 12/1998 | Depetro et al. | 257/343 |
| 7,262,471 | B2 * | 8/2007 | Pan et al. | 257/368 |
| 2002/0171103 | A1 * | 11/2002 | Spadea | 257/328 |
| 2004/0227183 | A1 * | 11/2004 | Negoro et al. | 257/338 |

FOREIGN PATENT DOCUMENTS
CN   1155764   7/1997

* cited by examiner

*Primary Examiner* — W. David Coleman
(74) *Attorney, Agent, or Firm* — J.C. Patents (57) ABSTRACT

A MOSFET with an isolation structure is provided. An N-type MOSFET includes a first N-type buried layer and a P-type epitaxial layer disposed in a P-type substrate. A P-type FET includes a second N-type buried layer and the N-type epitaxial layer disposed in the P-type substrate. The first, second N-type buried layers and the P-type epitaxial layer provide isolation between FETs. In addition, a plurality of separated P-type regions disposed in the P-type epitaxial layer further provides an isolation effect. A first gap exists between a first thick field oxide layer and a first P-type region, for raising a breakdown voltage of the N-type FET. A second gap exists between a second thick field oxide layer and a second N-well, for raising a breakdown voltage of the P-type FET.

12 Claims, 6 Drawing Sheets

MOSFET WITH ISOLATION STRUCTURE AND FABRICATION METHOD THEREOF

CROSS-REFERENCE TO RELATED APPLICATION

This application claims the priority benefit of PCT application serial no.: PCT/CN2005/001687, filed Oct. 14, 2006 which claims PRC application serial no.: 200510066850.2 filed Apr. 29, 2005. The entirety of each of the above-mentioned patent applications is hereby incorporated by reference herein and made a part of this specification.

BACKGROUND OF THE INVENTION

1. Field of the Invention

The present invention relates to a Metal Oxide Semiconductor Field Effect Transistor (MOSFET) with an isolation structure and a fabrication method thereof. More particularly, the present invention relates a MOSFET with an isolation structure formed through a low voltage complementary metal oxide semiconductor (LVCMOS) manufacturing process.

2. Description of Related Art

The integrated control circuit and driver transistor techniques have become the development trends of current power ICs. Therefore, it is a better solution for monolithic IC integration to use a standard manufacturing process to fabricate transistor devices. However, transistors fabricated by using the current standard manufacturing process are non-isolation structures, and a non-isolated transistor current could flow around the substrate. This may generate noise interference in the control circuit. Moreover, this transistor current can generate a ground bounce to disturb the control signals of the control circuit. Therefore, transistors of non-isolation structures are not suitable for the integration technique.

Figure 1:
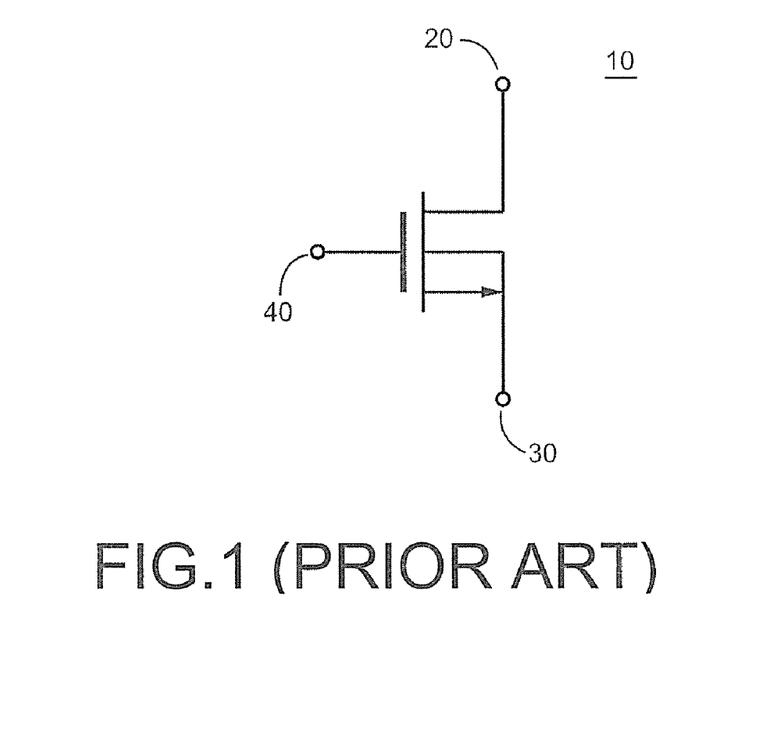
FIG. 1 is a schematic circuit diagram of an N-type MOSFET.
Figure 2:
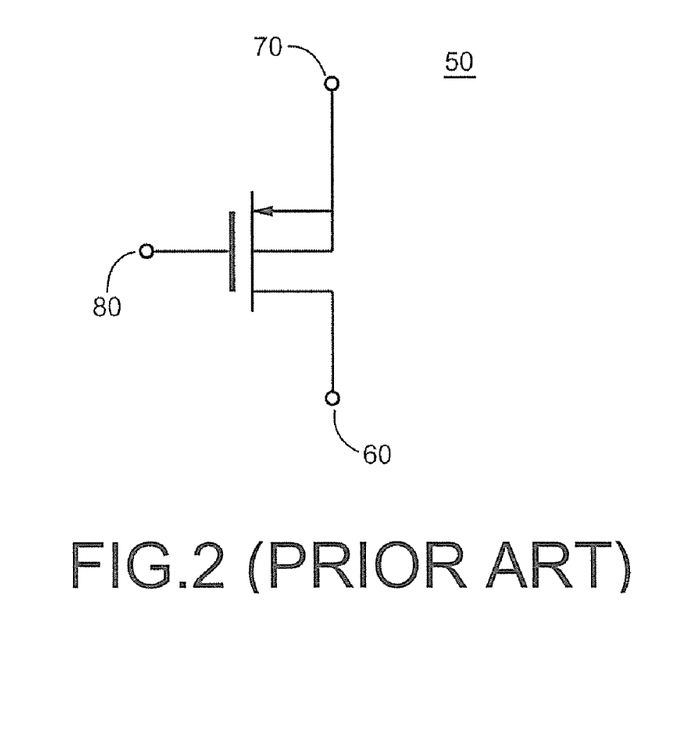
FIG. 2 is a schematic circuit diagram of a P-type MOSFET.

Referring to FIGS. 1 and 2, schematic circuit diagrams of an N-type and a P-type MOSFET are shown. As shown in the figures, the N-type MOSFET (NMOS) 10 includes a drain 20, a source 30, and a gate 40. The P-type MOSFET (PMOS) 50 includes a drain 60, a source 70, and a gate 80.

Figure 3:
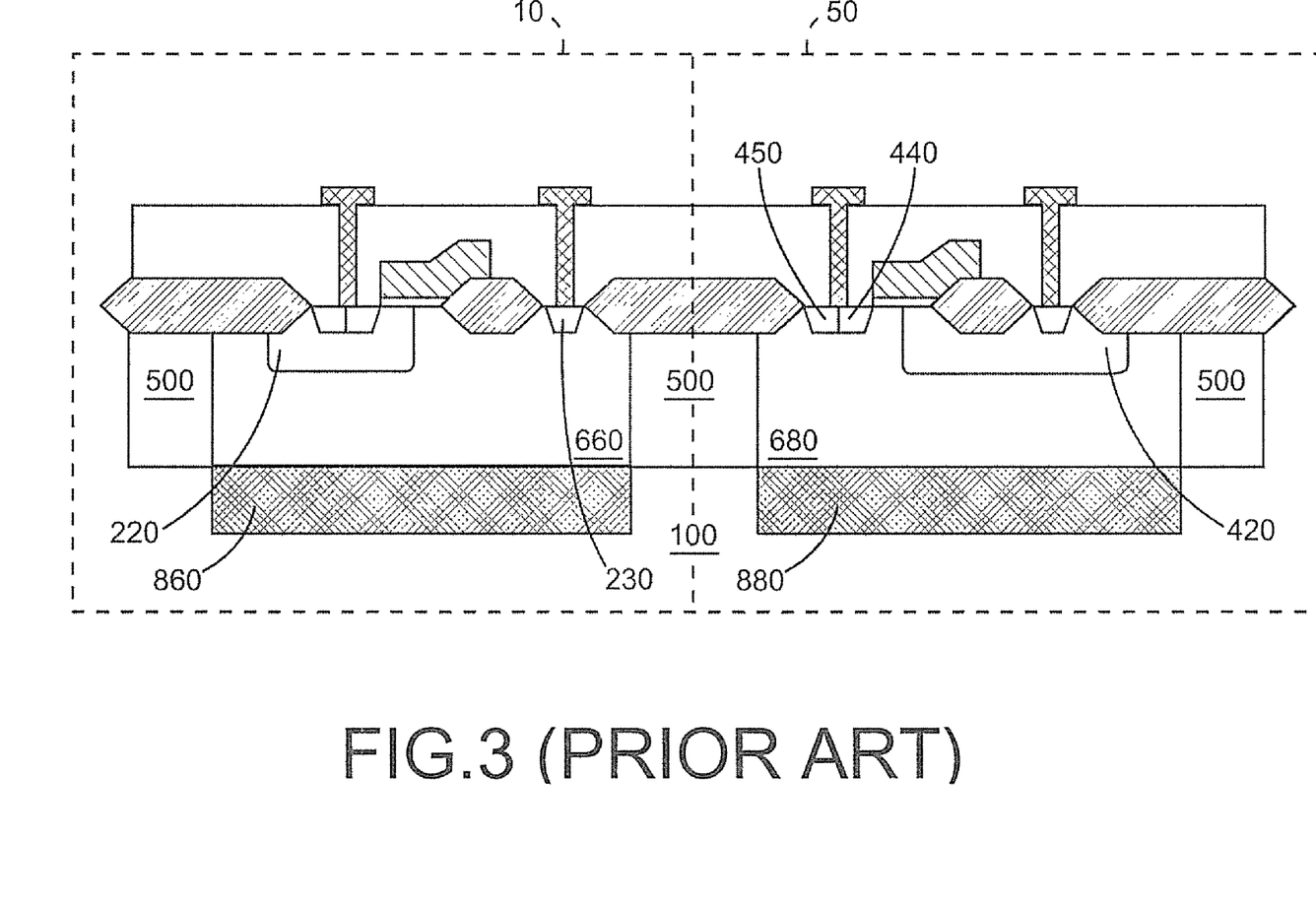
FIG. 3 is a structural cross-sectional view of a conventional MOSFET.

Referring to FIG. 3, a structural cross-sectional view of a conventional MOSFET is shown. As shown in the figure, an N-type MOSFET 10 and a P-type MOSFET 50 include a P-type substrate 100, an N+ buried layer 860 and a P+ buried layer 880 formed in the P-type substrate 100, an N-type epitaxial layer 660 and an N-type epitaxial layer 680 respectively formed on the N+ buried layer 860 and the P+ buried layer 880.

Furthermore, the conventional transistor isolation structure uses the N-type epitaxial layer 660 to surround a first drain region 230 and a first P-type region 220 of the N-type FET 10, and uses the N-type epitaxial layer 680 to surround a second source region 440, a second contact region 450, and a second P-type region 420 of the P-type FET 50. Meanwhile, a plurality of separated P+ regions 500 having P+ ions is formed between the N-type epitaxial layers 660 and 680, so as to provide isolation between the MOSFETs. However, the isolation structures formed by the above conventional method have drawbacks of a complicated manufacturing process and a high fabrication cost.

SUMMARY OF THE INVENTION

The present invention is directed to a MOSFET device with an isolation structure that realizes a higher breakdown voltage and low on-resistance, so as to achieve the purpose of monolithic IC integration. Instead of additional using masks to fabricate an epitaxial layer according to the conventional manufacturing process, the present invention only use a standard well structure to achieve the low cost, high yield, and isolated transistor structure.

In order to solve the above technical problems, according to an embodiment of the present invention, a MOSFET with an isolation structure formed through an LVCMOS manufacturing process is provided. The MOSFET includes an N-type MOSFET and a P-type MOSFET disposed in a P-type substrate. The N-type MOSFET includes a first N-type buried layer and a P-type epitaxial layer disposed in the P-type substrate; a first N-type diffusion region having N conductivity-type ions, forming a first N-well in the first N-type buried layer; a first P-type diffusion region having P conductivity-type ions, forming a first P-type region in the first N-well; a first drain diffusion region having N+ conductivity-type ions, forming a first drain region in the first N-type diffusion region; a first source diffusion region having N+ conductivity-type ions, forming a first source region; and a first contact diffusion region having P+ conductivity-type ions, forming a first contact region, wherein the first P-type diffusion region surrounds the first source region and the first contact region.

According to the N-type MOSFET of the present invention, the first P-type region located in the first N-well is formed through a P-well manufacturing process.

According to the N-type MOSFET of the present invention, the first P-type region located in the first N-well is formed through a P-type body/base manufacturing process.

The P-type MOSFET includes a second N-type buried layer and a P-type epitaxial layer disposed in the P-type substrate; a second N-type diffusion region having N conductivity-type ions, forming a second N-well in the second N-type buried layer; a second P-type diffusion region having P conductivity-type ions, forming a second P-type region in the second N-well; a second drain diffusion region having P+ conductivity-type ions, forming a second drain region in the second P-type diffusion region; a second source diffusion region having P+ conductivity-type ions, forming a second source region; and a second contact diffusion region having N+ conductivity-type ions, forming a second contact region, wherein the second N-type diffusion region surrounds the second source region and the second contact region.

According to the P-type MOSFET of the present invention, the second P-type region located in the second N-well is formed through a P-well manufacturing process.

According to the P-type MOSFET of the present invention, the second P-type region located in the second N-well is formed through a P-type body/base manufacturing process.

The first N-type buried layer, the second N-type buried layer, and the P-type epitaxial layer provide isolation between FETs. In addition, a plurality of separated P-type diffusion regions having P conductivity-type ions forms a plurality of separated P-type regions in the P-type epitaxial layer, so as to further provide isolation between FETs. The first P-type region located in the first N-type diffusion region, the second P-type region located in the second N-type diffusion region, the plurality of separated P-type regions, the first N-well, and the second N-well form depletion regions in regions of different polarities. A first channel is formed between the first source region and the first drain region. A second channel is formed between the second source region and the second drain region. A first gate is located on a first thin gate oxide layer and a first thick field oxide layer, for controlling an amount of current in the first channel. A second gate is located on a second thin gate oxide layer and a second thick field oxide layer, for controlling an amount of current in the second channel.

Furthermore, the first N-well and the second N-well respectively formed by the first N-type diffusion region and the second N-type diffusion region provide a low resistance path for the N-type MOSFET and the P-type MOSFET, for limiting the transistor current between the first drain region and the first source region and the transistor current between the second drain region and the second source region.

In order to solve the above technical problems, according to another embodiment of the present invention, a method of fabricating the MOSFET with an isolation structure formed through an LVCMOS manufacturing process is provided. A method of fabricating the N-type MOSFET is described as follows. First, a P-type substrate is formed. Then, a first N-type buried layer and a P-type epitaxial layer are formed in the P-type substrate. Next, a first N-well is formed in the first N-type buried layer in a first N-type diffusion region having N conductivity-type ions. After that, a first P-type region is formed in the first N-well in a first P-type diffusion region having P conductivity-type ions. Thereafter, a first drain region is formed in the first N-type diffusion region a first drain diffusion region having N+ conductivity-type ions. After that, a first source region is formed in a first source diffusion region having N+ conductivity-type ions, wherein a first channel is formed between the first source region and the first drain region.

Next, a first contact region is formed in a first contact diffusion region having P+ conductivity-type ions, wherein the first P-type diffusion region surrounds the first source region and the first contact region. After that, a plurality of separated P-type regions is formed in the P-type epitaxial layer in a plurality of separated P-type diffusion regions having P conductivity-type ions, so as to provide an isolation effect. Then, a first thin gate oxide layer and a first thick field oxide layer are formed on the P-type substrate. Next, a first gate is disposed on the first thin gate oxide layer and the first thick field oxide layer, for controlling an amount of current in the first channel. After that, the first gate and the first thick field oxide layer are covered with a silicon oxide insulating layer. Thereafter, a first drain metal contact having a first metal electrode connected with the first drain diffusion region is formed. After that, a first source metal contact having a second metal electrode connected to the first source diffusion region and the first contact diffusion region is formed. Finally, a first gap is formed between the first thick field oxide layer and the first P-type region, for raising a breakdown voltage of the N-type MOSFET.

According to a method of fabricating the N-type MOSFET of the present invention, the first P-type region located in the first N-well is formed through a P-well manufacturing process.

According to a method of fabricating the N-type MOSFET of the present invention, the first P-type region located in the first N-well is formed through a P-type body/base manufacturing process.

Furthermore, a method of fabricating the P-type MOSFET is described as follows. First, a P-type substrate is formed. Then, a second N-type buried layer and a P-type epitaxial layer are formed in the P-type substrate. Next, a second N-well is formed in the second N-type buried layer in a second N-type diffusion region having N conductivity-type ions. After that, a second P-type region is formed in the second N-well in a second P-type diffusion region having P conductivity-type ions. Thereafter, a second drain region is formed in the second P-type diffusion region in a second drain diffusion region having P+ conductivity-type ions. After that, a second source region is formed in a second source diffusion region having P+ conductivity-type ions, wherein a second channel is formed between the second source region and the second drain region.

Next, a second contact region is formed in a second contact diffusion region having N+ conductivity-type ions, wherein the second N-type diffusion region surrounds the second source region and the second contact region. After that, a plurality of separated P-type regions is formed in the P-type epitaxial layer in a plurality of separated P-type diffusion region having P conductivity-type ions, so as to provide an isolation effect. Then, a second thin gate oxide layer and a second thick field oxide layer are formed on the P-type substrate. Next, a second gate is disposed on the second thin gate oxide layer and the second thick field oxide layer, for controlling an amount of current in the second channel. After that, the second gate and the second thick field oxide layer are covered with a silicon oxide insulating layer. Thereafter, a second drain metal contact having a third metal electrode connected with the second drain diffusion region is formed. After that, a second source metal contact having a fourth metal electrode connected to the second contact diffusion region and the second source diffusion region is formed. Finally, a second gap is formed between the second thick field oxide layer and the second N-well, for raising a breakdown voltage of the P-type MOSFET.

According to a method of fabricating the P-type MOSFET of the present invention, the second P-type region located in the second N-well is formed through a P-well manufacturing process.

According to a method of fabricating the P-type MOSFET of the present invention, the second P-type region located in the second N-well is formed through a P-type body/base manufacturing process.

Instead of additional using masks to fabricate an epitaxial layer according to the conventional manufacturing process, the present invention only use a standard well structure to achieve the low cost, high yield, and isolated transistor structure, and merely use this simple fabricating process to realize a high breakdown voltage, low on-resistance, and the isolation structure, thereby achieving the purpose of monolithic IC integration.

In order to make the aforementioned and other objectives, features, and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 4:
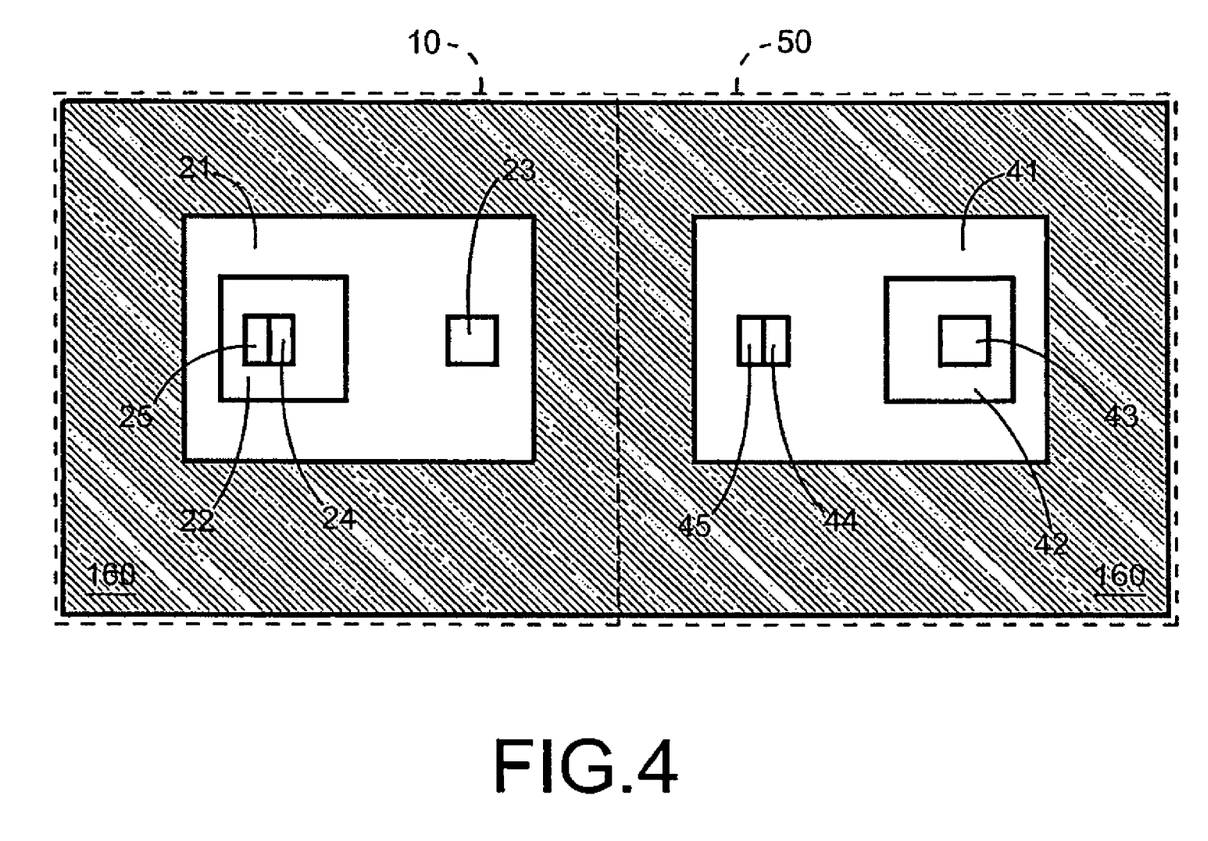
FIG. 4 is partial schematic top view of the MOSFET of the present invention.
Figure 5:
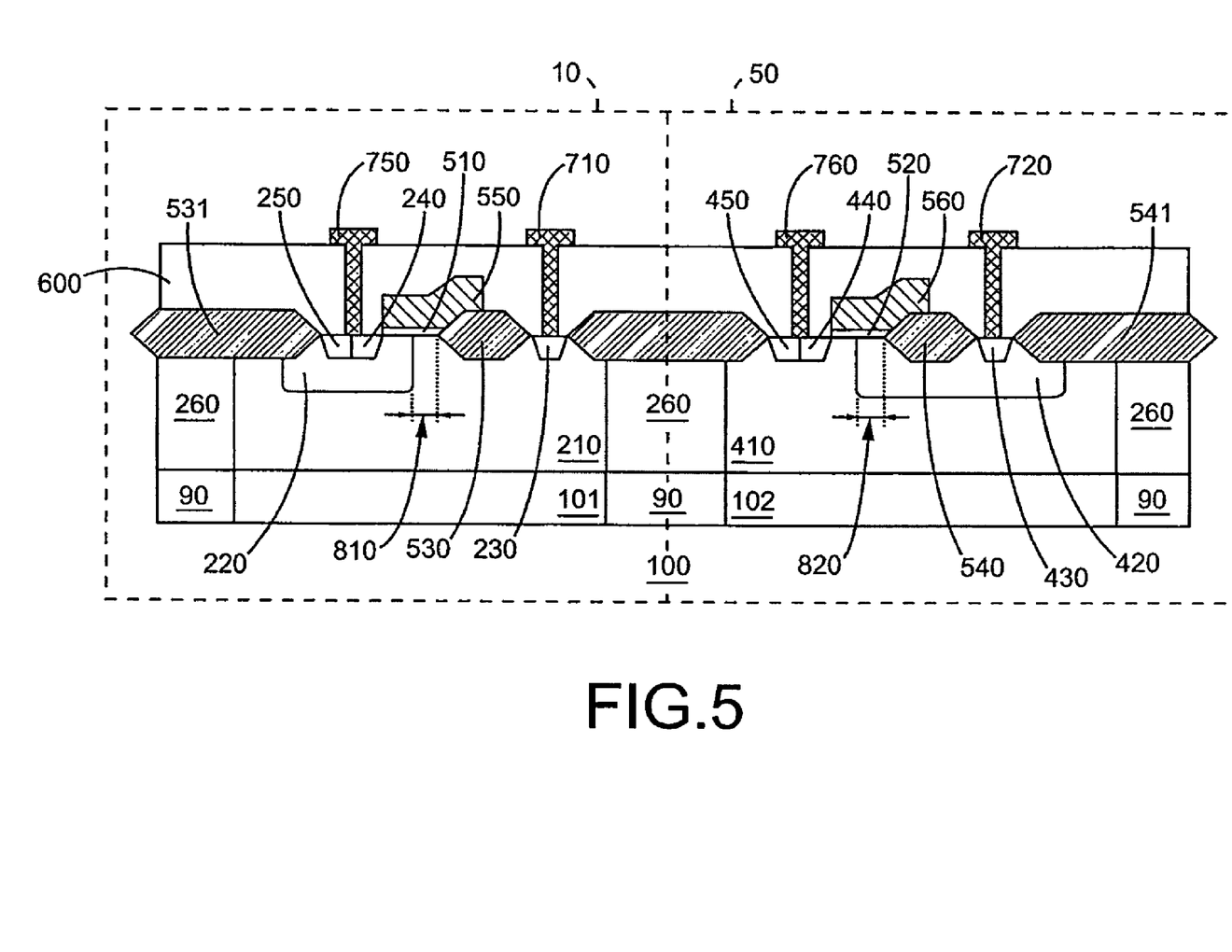
FIG. 5 is a schematic cross-sectional view of a structure of the MOSFET of the present invention.

Referring to FIGS. 4 and 5, a partial schematic top view and a schematic cross-sectional view of a structure of a MOSFET of the present invention are shown. As shown in the figures, an N-type MOSFET 10 of the present invention at least includes a P-type substrate 100; a first N-type buried layer 101 and a P-type epitaxial layer 90 disposed in the P-type substrate 100; a first N-type diffusion region 21 having N conductivity-type ions, forming a first N-well 210 in the first N-type buried layer 101; a first P-type diffusion region 22 having P conductivity-type ions, forming a first P-type region 220 in the first N-well 210; a first drain diffusion region 23 having N+ conductivity-type ions, forming a first drain region 230 in the first N-type diffusion region 21; a first source diffusion region 24 having N+ conductivity-type ions, forming a first source region 240; a first channel formed between the first source region 240 and the first drain region 230; and a first contact diffusion region 25 having P+ conductivity-type ions, forming a first contact region 250. Wherein, the first N-type diffusion region 21 surrounds the first source region 240 and the first contact region 250. The N-type FET 10 further includes a plurality of separated P-type diffusion regions 160, forming a plurality of separated P-type regions 260 in the P-type epitaxial layer 90, so as to provide isolation between MOSFETs.

In addition, a P-type MOSFET 50 of the present invention also includes the P-type substrate 100; a second N-type buried layer 102 and the P-type epitaxial layer 90 disposed in the P-type substrate 100; a second N-type diffusion region 41 having N conductivity-type ions, forming a second N-well 410 in the second N-type buried layer 102; a second P-type diffusion region 42 having P conductivity-type ions, forming a second P-type region 420 in the second N-well 410; a second drain diffusion region 43 having P+ conductivity-type ions, forming a second drain region 430 in the second P-type diffusion region 42; a second source diffusion region 44 having P+ conductivity-type ions, forming a second source region 440; a second channel formed between the second source region 440 and the second drain region 430; and a second contact diffusion region 45 having N+ conductivity-type ions, forming a second contact region 450. Wherein, the second N-type diffusion region 41 surrounds the second source region 440 and the second contact region 450. The P-type FET 50 further includes a plurality of separated P-type diffusion regions 160 having P conductivity-type ions, forming a plurality of separated P-type regions 260 in the P-type epitaxial layer 90, so as to provide isolation between MOSFETs.

Furthermore, the first P-type region 220 and the second P-type region 420 may be formed through a P-well or a P-type body/base manufacturing process. When the first P-type region 220 and the second P-type region 420 are the P-type body/base, the first N-well 210 and the second N-well 410 are the N-well. When the first P-type region 220 and the second P-type region 420 are the P-well, the first N-well 210 and the second N-well 410 are the deep N-well. As far as the concentration is concerned, the body/base is greater than the well, and the well is greater than the deep well.

In addition, a first thin gate oxide layer 510 and a second thin gate oxide layer 520, a first thick field oxide layer 530, a second thick field oxide layer 540, a third thick field oxide layer 531, a fourth thick field oxide layer 541 are formed on the P-type substrate 100. A first gate 550 is disposed on the first thin gate oxide layer 510 and the first thick field oxide layer 530, for controlling an amount of current in the first channel of the N-type MOSFET 10. A second gate 560 is disposed on the second thin gate oxide layer 520 and the second thick field oxide layer 540, for controlling an amount of current in the second channel of the P-type MOSFET 50. A silicon oxide insulating layer 600 covers the gates 550, 560 and thick field oxide layers 530, 531, 540, 541. A first drain metal contact 710 and a second drain metal contact 720 having metal electrodes are respectively connected with the first drain diffusion region 23 and the second drain diffusion region 43. A first source metal contact 750 having the metal electrode is connected with the first source diffusion region 24 and the first contact diffusion region 25. A second source metal contact 760 having the metal electrode is connected with the second source diffusion region 44 and the second contact diffusion region 45.

Furthermore, a first gap 810 exists between the first thick field oxide layer 530 and the first P-type region 220, for raising a breakdown voltage of the N-type MOSFET 10. A second gap 820 exists between the second thick field oxide layer 540 and the second N-well 410, for raising a breakdown voltage of the P-type MOSFET 50. The first P-type region 220 and the first N-well 210 generate a depletion region, and the second P-type region 420 and the second N-well 410 generate another depletion region, which are used in conjunction with the P-type region 260 to provide a better isolation effect between transistors.

Figure 6:
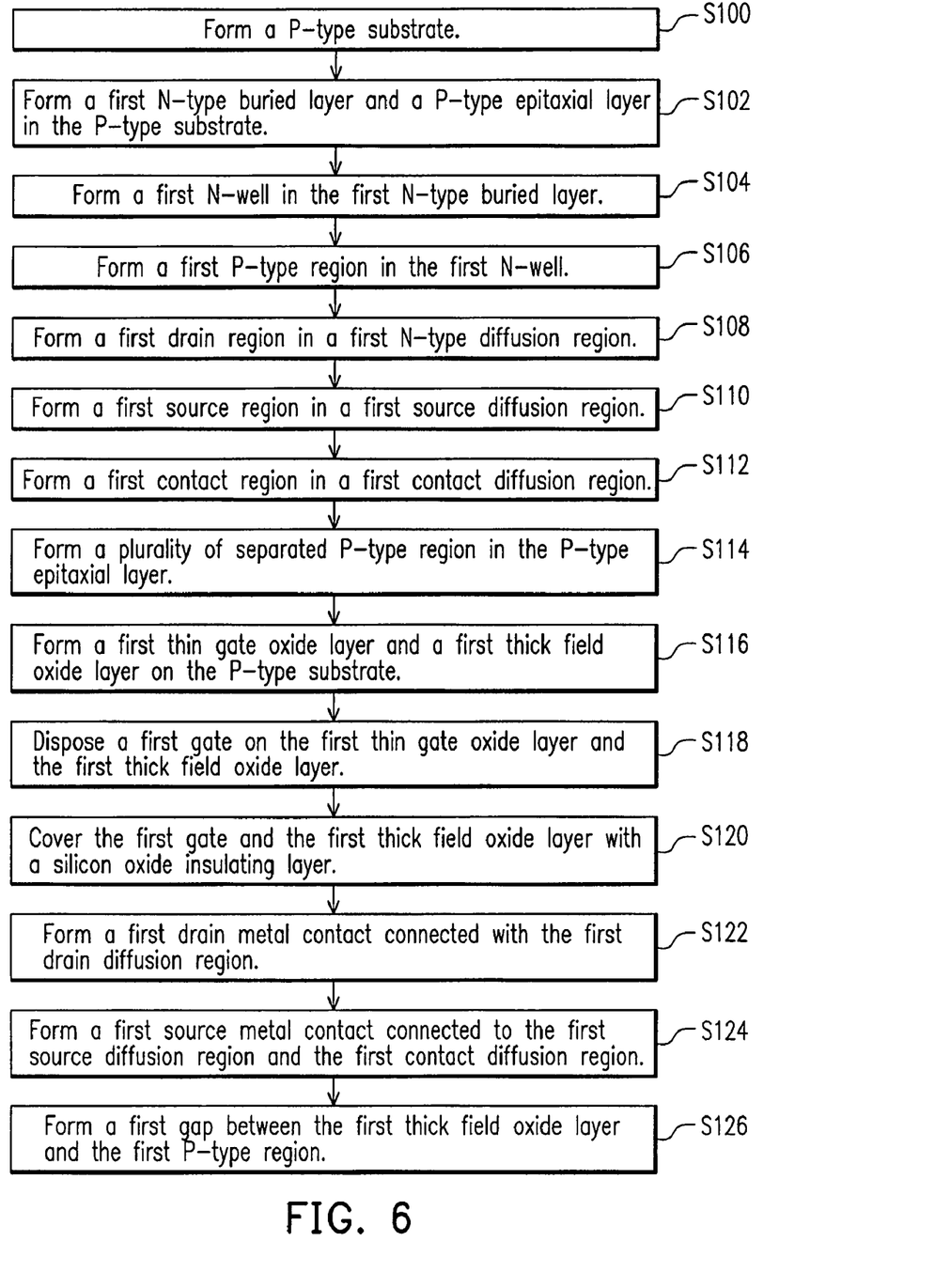
FIG. 6 is a flow chart of processes of a method of fabricating an N-type MOSFET of the present invention.

Referring to FIG. 6, a flow chart of processes of the method of fabricating the N-type MOSFET of the present invention is shown. As shown in the flow chart, the method of fabricating the N-type MOSFET is described as follows. First, a P-type substrate 100 is formed (S100). Then, a first N-type buried layer 101 and a P-type epitaxial layer 90 are formed in the P-type substrate 100 (S102). Next, a first N-well 210 is formed in the first N-type buried layer 101 in a first N-type diffusion region 21 having N conductivity-type ions (S104). After that, a first P-type region 220 is formed in the first N-well 210 in a first P-type diffusion region 22 having P conductivity-type ions (S106). Thereafter, a first drain region 230 is formed in the first N-type diffusion region 21 in a first drain diffusion region 23 having N+ conductivity-type ions (S108). After that, a first source region 240 is formed in a first source diffusion region 24 having N+ conductivity-type ions (S110), wherein a first channel is formed between the first source region 240 and the first drain region 230.

Next, a first contact region 250 is formed in a first contact diffusion region 25 having P+ conductivity-type ions (S112), wherein the first P-type diffusion region 22 surrounds the first source region 240 and the first contact region 250. After that, a plurality of separated P-type regions 260 is formed in the P-type epitaxial layer 90 in a plurality of separated P-type diffusion regions 160 having P conductivity-type ions, so as to provide an isolation effect (S114). Then, a first thin gate oxide layer 510 and a first thick field oxide layer 530 are formed on the P-type substrate 100 (S116). Next, a first gate 550 is disposed on the first thin gate oxide layer 510 and the first thick field oxide layer 530, for controlling an amount of current in the first channel (S118). After that, the first gate 550 and the first thick field oxide layer 530 are covered with a silicon oxide insulating layer 600 (S120). Thereafter, a first drain metal contact 710 having a first metal electrode connected with the first drain diffusion region 23 is formed (S122). After that, a first source metal contact 750 having a second metal electrode connected to the first source diffusion region 24 and the first contact diffusion region 25 is formed (S124). Finally, a first gap 810 is formed between the first thick field oxide layer 530 and the first P-type region 220, for raising a breakdown voltage of the N-type MOSFET (S126).

Figure 7:
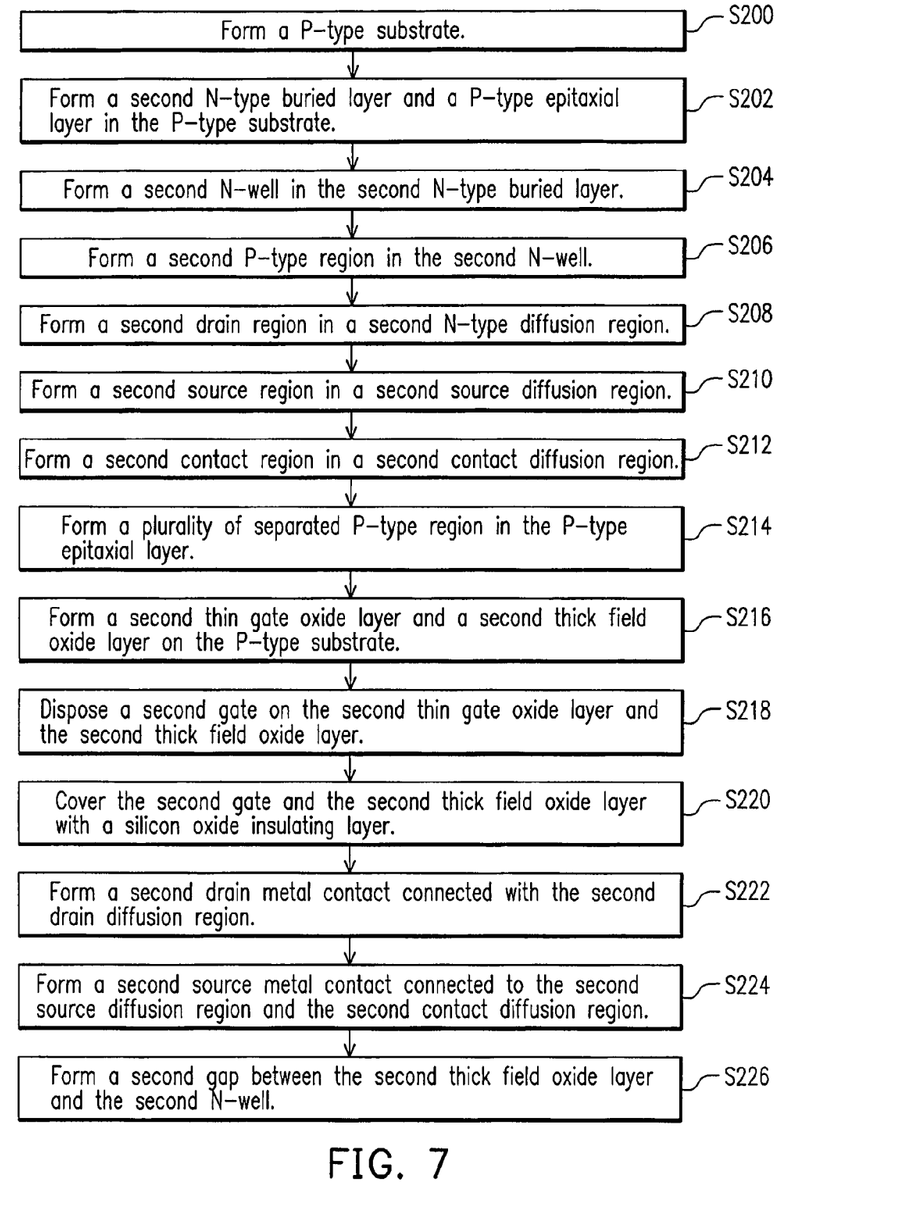
FIG. 7 is a flow chart of processes of a method of fabricating a P-type MOSFET of the present invention.

Referring to FIG. 7, a flow chart of processes of the method of fabricating the P-type MOSFET of the present invention is shown. As shown in the flow chart, the method of fabricating the P-type MOSFET is described as follows. First, a P-type substrate 100 is formed (S200). Then, a second N-type buried layer 102 and a P-type epitaxial layer 90 are formed in the P-type substrate 100 (S202). Next, a second N-well 410 is formed in the second N-type buried layer 102 in a second N-type diffusion region 41 having N conductivity-type ions (S204). After that, a second P-type region 420 is formed in the second N-well 410 in a second P-type diffusion region 42 having P conductivity-type ions (S206). Thereafter, a second drain region 430 is formed in the second P-type diffusion region 42 in a second drain diffusion region 43 having P+ conductivity-type ions (S208). After that, a second source region 440 is formed in a second source diffusion region 44 having P+ conductivity-type ions (S210), wherein a second channel is formed between the second source region 440 and the second drain region 430.

Next, a second contact region 450 is formed in a second contact diffusion region 45 having N+ conductivity-type ions (S212), wherein the second N-type diffusion region 41 surrounds the second source region 440 and the second contact region 450. After that, a plurality of separated P-type regions 260 is formed in the P-type epitaxial layer 90 in a plurality of separated P-type diffusion regions 160 having P conductivity-type ions, so as to provide an isolation effect (S214). Then, a second thin gate oxide layer 520 and a second thick field oxide layer 540 are formed on the P-type substrate 100 (S216). Next, a second gate 560 is disposed on the second thin gate oxide layer 520 and the second thick field oxide layer 540, for controlling an amount of current in the second channel (S218). After that, the second gate 560 and the second thick field oxide layer 540 are covered with a silicon oxide insulating layer 600 (S220). Thereafter, a second drain metal contact 720 having a third metal electrode connected with the second drain diffusion region 43 is formed (S222). After that, a second source metal contact 760 having a fourth metal electrode connected to the second contact diffusion region 45 and the second source diffusion region 44 is formed (S224). Finally, a second gap 820 is formed between the second thick field oxide layer 540 and the second N-well 410, for raising a breakdown voltage of the P-type MOSFET (S226).

In view of the above, a conventional transistor isolation structure adopts the N-type epitaxial layer 660 to surround the first drain region 230 and the first P-type region 220 of the N-type FET 10, and uses an N-type epitaxial layer 680 to surround the second source region 440, the second contact region 450, and the second P-type region 420 of the P-type FET 50. The FET device of the present invention, for example, the N-type MOSFET 10 and the P-type MOSFET 50, uses the first N-well 210 and the second N-well 410 in conjunction with other structures to achieve the isolation effect. In addition, the present invention has the advantages in terms of the structure and cost. In structure, the present invention uses the first N-type buried layer 101, the second N-type buried layer 102, and the P-type epitaxial layer 90 to enhance the isolation effect provided by only the well isolation structure. In cost, the present invention save the number of the masks for fabricating the N-type epitaxial layers 660, 680, the N+ buried layer 860, and the P+ buried layer 880, thus reducing the manufacturing cost.

Hence, instead of additional using masks to fabricate an epitaxial layer according to the conventional manufacturing process, the present invention only use a standard well structure to achieve the low cost, high yield, and isolated transistor structure. Also, the present invention uses a simplified manufacturing process to realize the effects of a high breakdown voltage, low on-resistance, and the isolation structure, thus further achieving the purpose of monolithic IC integration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An N-type metal oxide semiconductor field effect transistor (MOSFET), comprising:
    a P-type substrate;
    a first N-type buried layer and a P-type epitaxial layer, formed in the P-type substrate;
    a first N-type diffusion region having N conductivity-type ions, forming a first N-well in the first N-type buried layer;
    a first P-type diffusion region having P conductivity-type ions, forming a first P-type region in the first N-well;
    a first drain diffusion region having N+ conductivity-type ions, forming a first drain region in the first N-type diffusion region;
    a first source diffusion region having N+ conductivity-type ions, forming a first source region, wherein a first channel is formed between the first source region and the first drain region;
    a first contact diffusion region having P+ conductivity-type ions, forming a first contact region, wherein the first P-type diffusion region surrounds the first source region and the first contact region;
    a plurality of separated P-type diffusion regions having P conductivity-type ions, forming a plurality of separated P-type regions in the P-type epitaxial layer, so as to provide an isolation effect;
    a first thin gate oxide layer and a first thick field oxide layer, formed on the P-type substrate;
    a first gate, disposed on the first thin gate oxide layer and the first thick field oxide layer, for controlling an amount of current in the first channel;
    a silicon oxide insulating layer, covering the first gate and the first thick field oxide layer;
    a first drain metal contact, having a first metal electrode connected with the first drain diffusion region;
    a first source metal contact, having a second metal electrode connected to the first source diffusion region and the first contact diffusion region; and
    a first gap, formed between the first thick field oxide layer and the first P-type region, for raising a breakdown voltage of the N-type MOSFET.

2. The N-type MOSFET as claimed in claim 1, wherein the first P-type region located in the first N-well is formed through a P-well manufacturing process.

3. The N-type MOSFET as claimed in claim 1, wherein the first P-type region located in the first N-well is formed through a P-type body/base manufacturing process.

4. A P-type MOSFET, comprising:
    a P-type substrate;
    a second N-type buried layer and a P-type epitaxial layer, formed in the P-type substrate;
    a second N-type diffusion region having N conductivity-type ions, forming a second N-well in the second N-type buried layer;
    a second P-type diffusion region having P conductivity-type ions, forming a second P-type region in the second N-well;

a second drain diffusion region having P+ conductivity-type ions, forming a second drain region in the second P-type diffusion region;

a second source diffusion region having P+ conductivity-type ions, forming a second source region, wherein a second channel is formed between the second source region and the second drain region;

a second contact diffusion region having N+ conductivity-type ions, forming a second contact region, wherein the second N-type diffusion region surrounds the second source region and the second contact region;

a plurality of separated P-type diffusion regions having P conductivity-type ions, forming a plurality of separated P-type regions in the P-type epitaxial layer, so as to provide an isolation effect;

a second thin gate oxide layer and a second thick field oxide layer, formed on the P-type substrate;

a second gate, disposed on the second thin gate oxide layer and the second thick field oxide layer, for controlling an amount of current in the second channel;

a silicon oxide insulating layer, covering the second gate and the second thick field oxide layer;

a second drain metal contact, having a third metal electrode connected with the second drain diffusion region;

a second source metal contact, having a fourth metal electrode connected to the second contact diffusion region and the second source diffusion region; and a second gap, formed between the second thick field oxide layer and the second N-well, for raising a breakdown voltage of the P-type MOSFET.

5. The P-type MOSFET as claimed in claim 4, wherein the second P-type region located in the second N-well is formed through a P-well manufacturing process.

6. The P-type MOSFET as claimed in claim 4, wherein the second P-type region located in the second N-well is formed through a P-type body/base manufacturing process.

7. A method of fabricating an N-type MOSFET, comprising:

forming a P-type substrate;

forming a first N-type buried layer and a P-type epitaxial layer in the P-type substrate;

forming a first N-well in the first N-type buried layer in a first N-type diffusion region having N conductivity-type ions;

forming a first P-type region in the first N-well in a first P-type diffusion region having P conductivity-type ions;

forming a first drain region in the first N-type diffusion region in a first drain diffusion region having N+ conductivity-type ions;

forming a first source region in a first source diffusion region having N+ conductivity-type ions, wherein a first channel is formed between the first source region and the first drain region;

forming a first contact region in a first contact diffusion region having P+ conductivity-type ions, wherein the first P-type diffusion region surrounds the first source region and the first contact region;

forming a plurality of separated P-type regions in the P-type epitaxial layer in a plurality of separated P-type diffusion regions having P conductivity-type ions, so as to provide an isolation effect;

forming a first thin gate oxide layer and a first thick field oxide layer on the P-type substrate;

disposing a first gate on the first thin gate oxide layer and the first thick field oxide layer, for controlling an amount of current in the first channel;

covering the first gate and the first thick field oxide layer with a silicon oxide insulating layer;

forming a first drain metal contact having a first metal electrode connected with the first drain diffusion region;

forming a first source metal contact having a second metal electrode connected to the first source diffusion region and the first contact diffusion region; and forming a first gap between the first thick field oxide layer and the first P-type region, for raising a breakdown voltage of the N-type MOSFET.

8. The method of fabricating an N-type MOSFET as claimed in claim 7, wherein the first P-type region located in the first N-well is formed through a P-well manufacturing process.

9. The method of fabricating an N-type MOSFET as claimed in claim 7, wherein the first P-type region located in the first N-well is formed through a P-type body/base manufacturing process.

10. A method of fabricating a P-type MOSFET, comprising:

forming a P-type substrate;

forming a second N-type buried layer and a P-type epitaxial layer in the P-type substrate;

forming a second N-well in the second N-type buried layer in a second N-type diffusion region having N conductivity-type ions;

forming a second P-type region in the second N-well in a second P-type diffusion region having P conductivity-type ions;

forming a second drain region in the second P-type diffusion region in a second drain diffusion region having P+ conductivity-type ions;

forming a second source region in a second source diffusion region having P+conductivity-type ions, wherein a second channel is formed between the second source region and the second drain region;

forming a second contact region in a second contact diffusion region having N+ conductivity-type ions, wherein the second N-type diffusion region surrounds the second source region and the second contact region;

forming a plurality of separated P-type regions in the P-type epitaxial layer in a plurality of separated P-type diffusion regions having P conductivity-type ions, so as to provide an isolation effect;

forming a second thin gate oxide layer and a second thick field oxide layer on the P-type substrate;

disposing a second gate on the second thin gate oxide layer and the second thick field oxide layer, for controlling an amount of current in the second channel;

covering the second gate and the second thick field oxide layer with a silicon oxide insulating layer;

forming a second drain metal contact having a third metal electrode connected with the second drain diffusion region;

forming a second source metal contact having a fourth metal electrode connected to the second contact diffusion region and the second source diffusion region; and forming a second gap between the second thick field oxide layer and the second N-well, for raising a breakdown voltage of the P-type MOSFET.

11. The method of fabricating a P-type MOSFET as claimed in claim 10, wherein the second P-type region located in the second N-well is formed through a P-well manufacturing process.

12. The method of fabricating a P-type MOSFET as claimed in claim 10, wherein the second P-type region located in the second N-well is formed through a P-type body/base manufacturing process.

* * * * *